US008835828B2

(12) United States Patent
Kobayashi (10) Patent No.: US 8,835,828 B2
(45) Date of Patent: Sep. 16, 2014

(54) PHOTOELECTRIC CONVERSION APPARATUS

(75) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 820 days.

(21) Appl. No.: 13/088,472

(22) Filed: Apr. 18, 2011

(65) Prior Publication Data

US 2011/0278438 A1 Nov. 17, 2011

(30) Foreign Application Priority Data

May 12, 2010 (JP) .................................. 2010-110518

(51) Int. Cl.
*H01J 40/14* (2006.01)
*H01L 31/02* (2006.01)

(52) U.S. Cl.
CPC ................................ *H01L 31/02019* (2013.01)
USPC ..................................................... 250/214 R

(58) Field of Classification Search
USPC ....... 250/214 R, 214.1, 214 C; 348/308–311; 356/218–222
See application file for complete search history.

(56) References Cited

U.S. PATENT DOCUMENTS

| 4,882,482 A | * | 11/1989 | Smith et al. ................ 250/214 A |
| 5,008,525 A | * | 4/1991 | Petronio .................... 250/214 C |
| 6,300,615 B1 | | 10/2001 | Shinohara et al. ........ 250/214 R |
| 7,622,699 B2 | | 11/2009 | Sakakibara et al. ....... 250/208.1 |
| 8,115,159 B2 | | 2/2012 | Sakakibara et al. ....... 250/208.1 |
| 2009/0141157 A1 | | 6/2009 | Kobayashi et al. ........... 348/308 |

FOREIGN PATENT DOCUMENTS

| CN | 101296330 A | 10/2008 |
| JP | 01-165275 | 6/1989 |
| JP | 03-188337 | 8/1991 |
| JP | 08-181348 | 7/1996 |
| JP | 2000-077644 A | 3/2000 |
| JP | 2009-265000 | 11/2009 |
| JP | 2010-045294 | 2/2010 |

OTHER PUBLICATIONS

Notification of the First Office Action from the Chinese Patent Office dated May 21, 2013, issued in counterpart Chinese Appl'n. No. 2011-10117494.8, with English-language translation.

* cited by examiner

*Primary Examiner* — Seung C Sohn
(74) *Attorney, Agent, or Firm* — Fitzpatrick, Cella, Harper & Scinto (57) ABSTRACT

A photoelectric conversion apparatus comprises: a first current amplifier for amplifying a current input through a first current input terminal; a first initializing unit for initializing a voltage of the first current input terminal; a first detector for detecting the voltage of the first current input terminal; a first feedback unit for feeding back the voltage to the first current amplifier; and a correction unit including a second current amplifier for amplifying a current input through a second current input terminal; a second initializing unit for initializing a voltage input through the second current input terminal; a second detector for detecting the voltage of the second current input terminal; a second feedback unit for feeding back the voltage detected by the second detector to the second current amplifier; and an arithmetic operation unit for correcting the current amplified by the first current amplifier.

11 Claims, 11 Drawing Sheets

PHOTOELECTRIC CONVERSION APPARATUS

BACKGROUND OF THE INVENTION

1. Field of the Invention

The present invention relates to a photoelectric conversion apparatus.

2. Description of the Related Art

FIG. 1 in Japanese Patent Application Laid-Open No. 2000-77644 illustrates a photoelectric conversion apparatus using a phototransistor. In the Figure, a constant current source and a MOSFET driven by the constant current source provide a common source circuit, and the gate-source voltage of the MOSFET determines the base potential of the phototransistor. In the Figure, when the amount of light changes, the emitter current of the phototransistor changes, and thus, the base-emitter voltage changes. In such case, not the base potential but the emitter potential of the phototransistor mainly changes. Accordingly, the base potential is maintained substantially constant during operation once the base potential is set to a stationary voltage.

However, in the Figure, when power is applied, that is, when a power supply terminal voltage is set to a source voltage from 0 V, a long time is required for the base potential to reach a stationary voltage from 0 V. This is because time is consumed for charging a parasitic capacitance parasitic in the base with a photocurrent of the phototransistor: as the luminance becomes lower, more time is required because the photocurrent is smaller. Consequently, a very long time is required for the emitter current of the phototransistor (an output current of a pixel) to converge. Therefore, normally, a unit that resets the base potential is provided as in the Figure (for example, an MOSFET with an a source-drain terminal connected to the base and the other terminal connected to a reset potential), and by turning on the MOSFET when power is applied, the base potential is reset so as to have a value slightly higher than the stationary voltage. In such case, because of the characteristics of a common source circuit, the gate potential of the MOSFET is lowered, whereby the emitter potential of the phototransistor being lowered. Consequently, a large current is output from the emitter of the phototransistor. After cancellation of the reset, that is, after turning off the MOSFET, the base current is larger than the photocurrent because of the large emitter current, and thus, excess charge is drawn out from the base, and the base potential is gradually stabilized to the stationary voltage. Furthermore, concurrently with that, the emitter current Ie also converges (decreases), and finally converges on a value obtained by expression (1) below.

[Expression 1]

$$I_e \approx hFE \times (I_p + I_d) \quad (1)$$

Here, hFE is a current amplification factor of the phototransistor, Ip is the photocurrent, and Id is a dark current. The temporal waveform of the emitter current Ie shows a waveform in which an excessive current is generated in a reset period and the excessive current is gradually lowered and finally converges on a value determined by expression (1). From expression (1), the converged value of the emitter current Ie depends on the photocurrent Ip, and as the photocurrent Ip is lower, time is required more for convergence. Even when such reset operation is performed, a long time is still required for convergence of the emitter current Ie.

SUMMARY OF THE INVENTION

An object of the present invention is to provide a photoelectric conversion apparatus including a photoelectric conversion element, in which an output current exhibits favorable converging characteristics when the photoelectric conversion element is initialized (reset).

A photoelectric conversion apparatus according to the present invention comprises: a first photoelectric conversion element for generating a current by a photoelectric conversion; a first current amplifier for amplifying the current inputted from the first photoelectric conversion element through a first current input terminal; a first initializing unit for initializing a voltage of the first current input terminal; a first detector for detecting the voltage of the first current input terminal; a first feedback unit for feeding back the voltage detected by the first detector to the first current amplifier as a feedback signal; and a correcting unit for correcting the current amplified by the first current amplifier, wherein the correcting unit comprises a second current amplifier for amplifying a current inputted through a second current input terminal; a second initializing unit for initializing a voltage of the second current input terminal; a second detector for detecting the voltage of the second current input terminal; a second feedback unit for feeding back the voltage detected by the second detector to the second current amplifier as a feedback signal; and an arithmetic operation unit for performing an arithmetic operation based on the current amplified by the first current amplifier and the current amplified by the second current amplifier, to correct the current amplified by the first current amplifier.

The present invention enables provision of a photoelectric conversion apparatus including a photoelectric conversion element, in which an output current exhibits favorable converging characteristics when the photoelectric conversion element is initialized.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
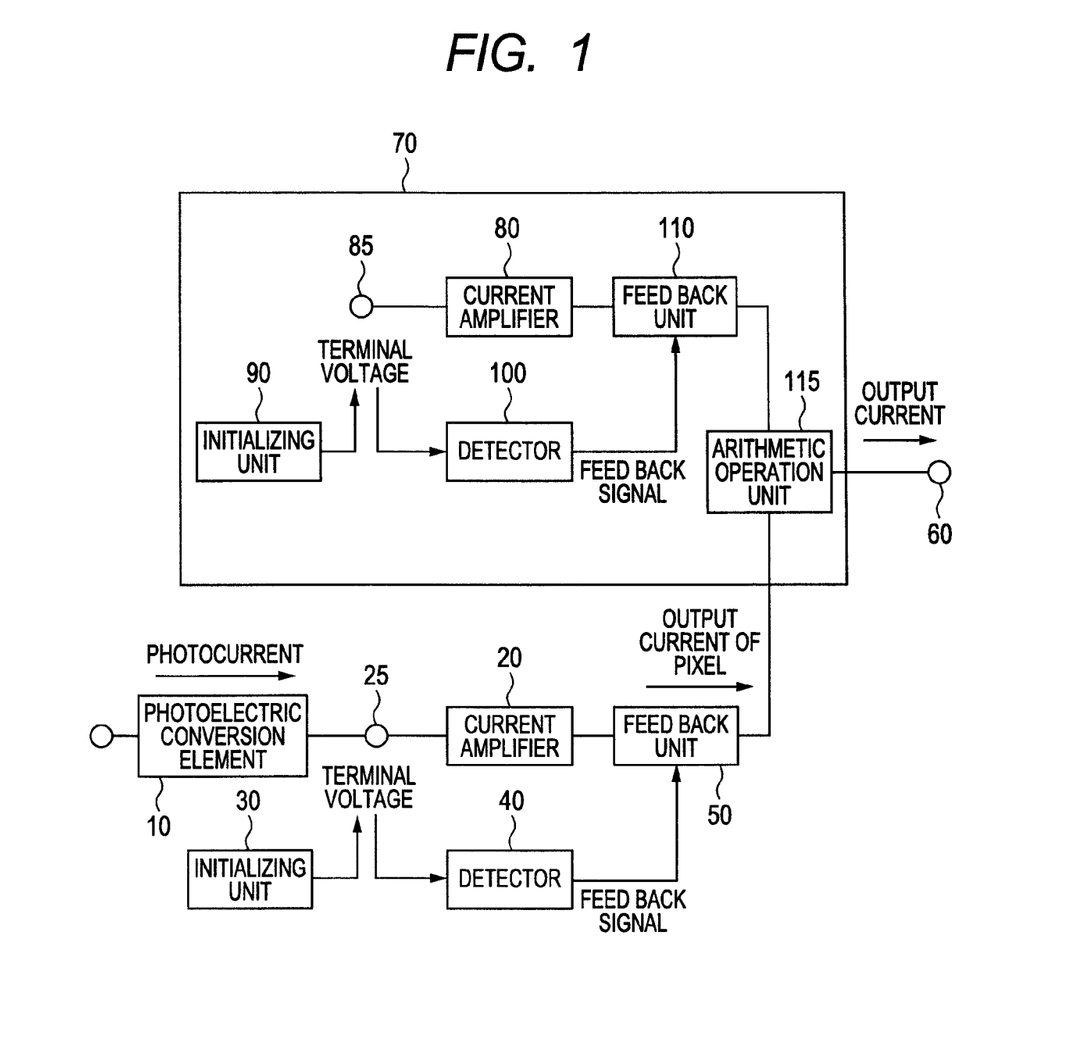
FIG. 1 is a diagram illustrating an exemplary configuration of a photoelectric conversion apparatus according to a first embodiment of the present invention.

FIG. 1 is a schematic diagram illustrating an exemplary configuration of a photoelectric conversion apparatus according to a first embodiment of the present invention. The photoelectric conversion apparatus in FIG. 1 includes a first photoelectric conversion element 10, a first current amplifier 20, a first current input terminal 25, a first initializing unit 30, a first detector 40, a first feedback unit 50, a correction unit 70 and a current output terminal 60. The first photoelectric conversion element 10 generates a current by means of a photoelectric conversion. A photoelectric conversion converts light into an electronic signal. The first current amplifier 20 amplifies a current input from the first photoelectric conversion element 10 through the first current input terminal 25. The first initializing unit 30 initializes a voltage of the first current input terminal 25. The first detector 40 detects the voltage of the first current input terminal 25. The first feedback unit 50 feeds back the voltage detected by the first detector 40 to the first current amplifier 20 as a feedback signal. The correction unit 70 includes a second current amplifier 80, a second current input terminal 85, a second initializing unit 90, a second detector 100, a second feedback unit 110 and an arithmetic operation unit 115. The correction unit 70 corrects the current amplified by the first current amplifier 20. The second current amplifier 80 amplifies a current input through the second current input terminal 85. The second initializing unit 90 initializes a voltage of the second current input terminal 85. The second detector 100 detects the voltage of the second current input terminal 85. The second feedback unit 110 feeds back the voltage detected by the second detector 100 to the second current amplifier 80 as a feedback signal. The arithmetic operation unit 115 performs an arithmetic operation using the current amplified by the first current amplifier 20 and the current amplified by the second current amplifier 80, to correct the current amplified by the first current amplifier 20.

In FIG. 1, when the first initializing unit 30 initializes a terminal voltage of the first current input terminal 25 so as to have a value that is higher than a stationary value, the first detector 40 detects the initialized terminal voltage, and the first feedback unit 50 feeds the initialized terminal voltage back to the first current amplifier 20. Consequently, excessive current components are generated in the output current of the first current amplifier 20. Here, in the correction unit 70, also, the second initializing unit 90 initializes a terminal voltage of the second current input terminal 85 of the second current amplifier 80 so as to have a value that is higher than a stationary value. Then, the voltage is detected by the second detector 100, and the second feedback unit 110 feeds the voltage back to the second current amplifier 80, thereby excessive current components being generated in the output current of the second current amplifier 80. Using the output current of the second current amplifier 80, the arithmetic operation unit 115 corrects the output current of the first current amplifier 20, thereby reducing the excessive current components, enabling enhancement of the converging characteristics of the current output from the current output terminal 60. Consequently, the configuration enables provision of a photoelectric conversion apparatus in which when an operation to reset the first photoelectric conversion element 10 is performed, an output current from the pixel exhibits favorable converging characteristics.

Figure 2:
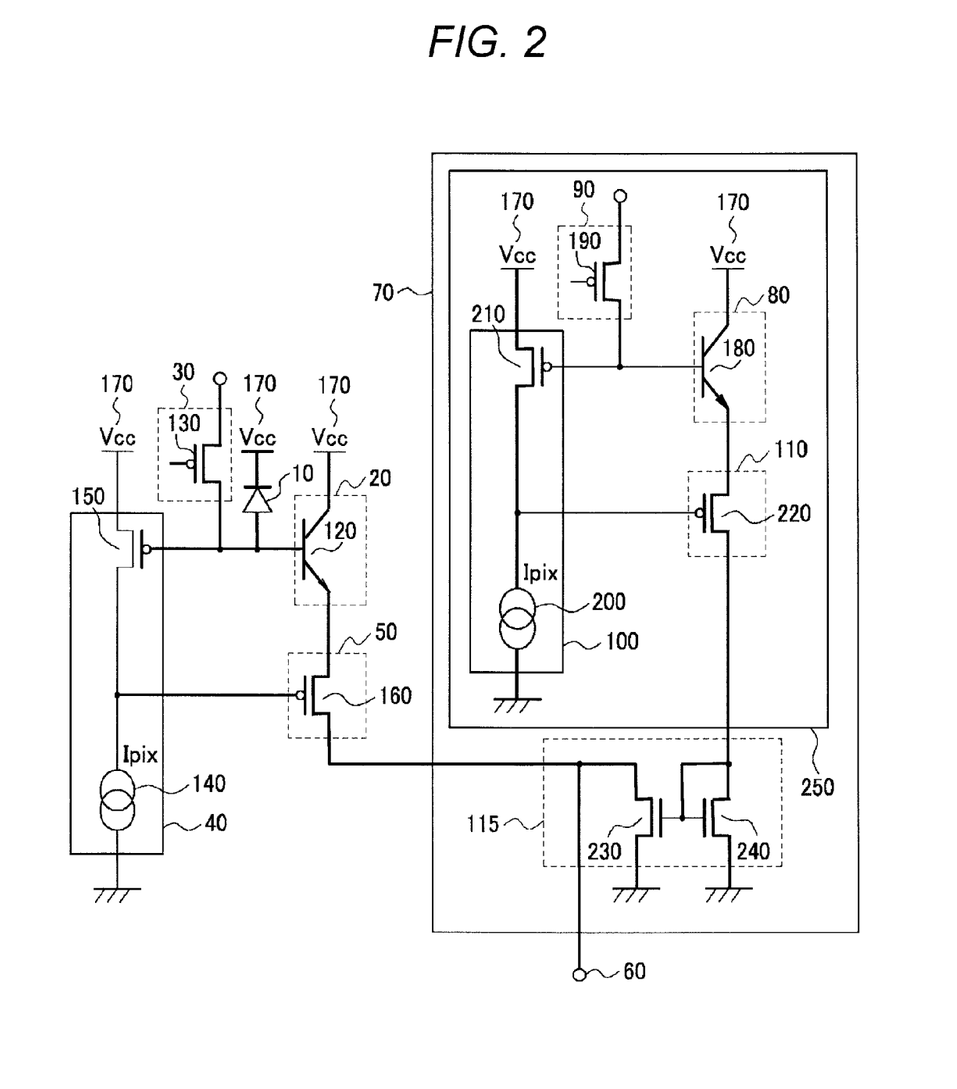
FIG. 2 is a diagram illustrating an exemplary configuration of the photoelectric conversion apparatus according to the first embodiment of the present invention.

FIG. 2 is a diagram illustrating an exemplary circuit configuration of the photoelectric conversion apparatus in FIG. 1. First, the correspondence between FIGS. 1 and 2 will be described. In FIG. 2, a bipolar transistor 120 is used as the current amplifier 20, and a MOS field-effect transistor (FET) 130 is used as the initializing unit 30. The detector 40 is provided by a constant current source 140 and a MOSFET 150. A MOSFET 160 is used as the feedback unit 50. Furthermore, a bipolar transistor 180 is used as the current amplifier 80 and a MOSFET 190 is used as the initializing unit 90. The detector 100 is provided by a constant current source 200 and a MOSFET 210. Furthermore, a MOSFET 220 is used as the feedback unit 110, and a current mirror circuit including MOSFETs 230 and 240 is used as the arithmetic operation unit 115. In FIG. 2, the bipolar transistor 180, the MOSFET 190, the constant current source 200, the MOSFET 210 and the MOSFET 220 are included in a correction pixel 250. A current output terminal 60 and a source voltage terminal 170 are also provided. A first photoelectric conversion element 10 includes, for example, a first photodiode that performs a photoelectric conversion.

The first current amplifier 20 includes the first bipolar transistor 120 with a base connected to an anode of the first photodiode 10 and a collector connected to a source voltage node 170, the first bipolar transistor 120 outputting an amplified current from an emitter thereof. The first initializing unit 30 includes the first field-effect transistor (MOSFET) 130 with a gate connected to a reset signal input terminal, a drain connected to a base of the first bipolar transistor 120 and a source connected to a reset voltage node. The first detector 40 includes the second field-effect transistor (MOSFET) 150 with a gate connected to the base of the first bipolar transistor 120 and a source connected to the source voltage node 170, and the first constant current source 140. The first current source 140 is connected between a drain of the second MOSFET 150 and a reference voltage (ground potential) node. The first feedback unit 50 includes the third field-effect transistor (MOSFET) 160 with a source connected to the emitter of the first bipolar transistor 120, a gate connected to the drain of the second MOSFET 150 and a drain connected to the correction unit 70.

The second current amplifier 80 includes the second bipolar transistor 180 with a collector connected to the source voltage node 170, the second bipolar transistor 180 outputting an amplified current from an emitter thereof. The second initializing unit 90 includes the fourth field-effect transistor (MOSFET) 190 with a gate connected to the reset signal input terminal, a drain connected to a base of the second bipolar transistor 180 and a source connected to the reset voltage node. The second detector 100 includes the fifth field-effect transistor (MOSFET) 210 with a gate connected to the base of the second bipolar transistor 180 and a source connected to the source voltage node 170, and the second constant current source 200. The second constant current source 200 is connected between a drain of the fifth MOSFET 210 and the reference voltage node. The second feedback unit 110 includes the sixth field-effect transistor (MOSFET) 220 with a source connected to the emitter of the second bipolar transistor 180, a gate connected to the drain of the fifth MOSFET 210 and a drain connected to the correction unit 70.

The arithmetic operation unit 115 includes the seventh field-effect transistor (MOSFET) 230 and the eighth field-effect transistor (MOSFET) 240. A drain of the seventh MOSFET 230 is connected to the drain of the third MOSFET 160 and a source of the same is connected to the reference voltage node. A gate of the eighth MOSFET 240 is connected to a drain of its own and a gate of the seventh MOSFET 230, a drain of the same is connected to the drain of the sixth MOSFET 220, and a source of the same is connected to the reference voltage node. The current output terminal 60 is connected to the drain of the seventh MOSFET 230.

Next, an operation of the photoelectric conversion apparatus in FIG. 2 will be described. In FIG. 2, the relationship between a current Ipix flowing through each of the MOSFETs 150 and 210 and a voltage Vgs between the gate and the source of each of the MOSFETs 150 and 210 can be calculated by expression (2) below.

[Expression 2]

$$I_{pix} = \frac{\beta}{2}(V_{gs} - V_{th})^2(1 + \lambda V_{ds}) \quad (2)$$

Here, Vth is a threshold value, Vds is the voltage between the drain and the source of each of the MOSFETs 150 and 210, and λ is a channel length modulation coefficient. Furthermore, β can be calculated by expression (3) below.

[Expression 3]

$$\beta = \mu_0 C_{ox} \frac{W}{L} \quad (3)$$

Here, $\mu_0$ is a carrier mobility, Cox is a gate capacitance per unit area of the MOSFET, W is a gate width of the MOSFET and L is a gate length of the MOSFET. From expression (2), Vgs can be calculated by expression (4) below.

[Expression 4]

$$V_{gs} = V_{th} + \sqrt{\frac{2I_{pix}}{\beta(1+\lambda V_{ds})}} \approx V_{th} + \sqrt{\frac{2I_{pix}}{\beta}} \quad (4)$$

A value obtained by subtracting such value from the source voltage Vcc, that is, expression (5) is a stationary value of a base potential Vb of each of the bipolar transistors 120 and 180.

[Expression 5]

$$V_b \approx V_{cc} - V_{th} - \sqrt{\frac{2I_{pix}}{\beta}} \quad (5)$$

In FIG. 2, when power is applied, each of the MOSFETs 130 and 190 is turned on, thereby resetting the base potential of each of the bipolar transistors 120 and 180 so as to have a value slightly higher than that obtained by expression (5) (for example, around 100 mV). In such case, the gate-source voltage Vgs of each of the MOSFETs 150 and 210 has a value smaller than that obtained by expression (4). Accordingly, in expression (2), Vds increases by the amount of the decrease of Vgs, thereby lowering the gate potential of each of the MOSFETs 160 and 220. Consequently, the emitter potential of each of the bipolar transistors 120 and 180 is lowered, and a large current is output from each of the emitters. Thus, immediately after cancellation of the reset, that is, each of the MOSFETs 130 and 190 is turned off, a current larger than a photocurrent (generated in the photoelectric conversion element 10) or a dark current, which is input to the base of each of the bipolar transistors 120 and 180 flows from the base. The dark current mentioned here includes, for example, a generated current coming from a depletion layer of a base-collector junction of each of the bipolar transistors 120 and 180. Consequently, excess charge is drawn out from the base of each of the bipolar transistors 120 and 180, and the respective base potentials are gradually stabilized to a stationary voltage. Concurrently with that, the respective emitter currents converge (decrease). Finally, the emitter current Ie1 of the bipolar transistor 120 converges on a value obtained by expression (6) below.

[Expression 6]

$$I_{e1} \approx hFE \times (I_p + I_{d1} + I_{d2}) \quad (6)$$

Here, hFE is a current amplification factor for the bipolar transistor 120, Ip is the photocurrent of the photoelectric conversion element 10 and Id1 is the dark current of the photoelectric conversion element 10. Furthermore, Id2 is dark current components resulting from components other than the photoelectric conversion element 10, for example, a sum of, e.g., an off-current of the MOSFET 130 and the generated current coming from the depletion layer of the base-collector junction of the bipolar transistor 120. Since the photoelectric conversion element 10 is not connected to the base of the bipolar transistor 180, the emitter current Ie2 of the bipolar transistor 180 converges on a value obtained by expression (7) irrespective of the amount of light applied.

[Expression 7]

$$I_{e2} \approx hFE \times (I_{d2}) \quad (7)$$

Figure 3:
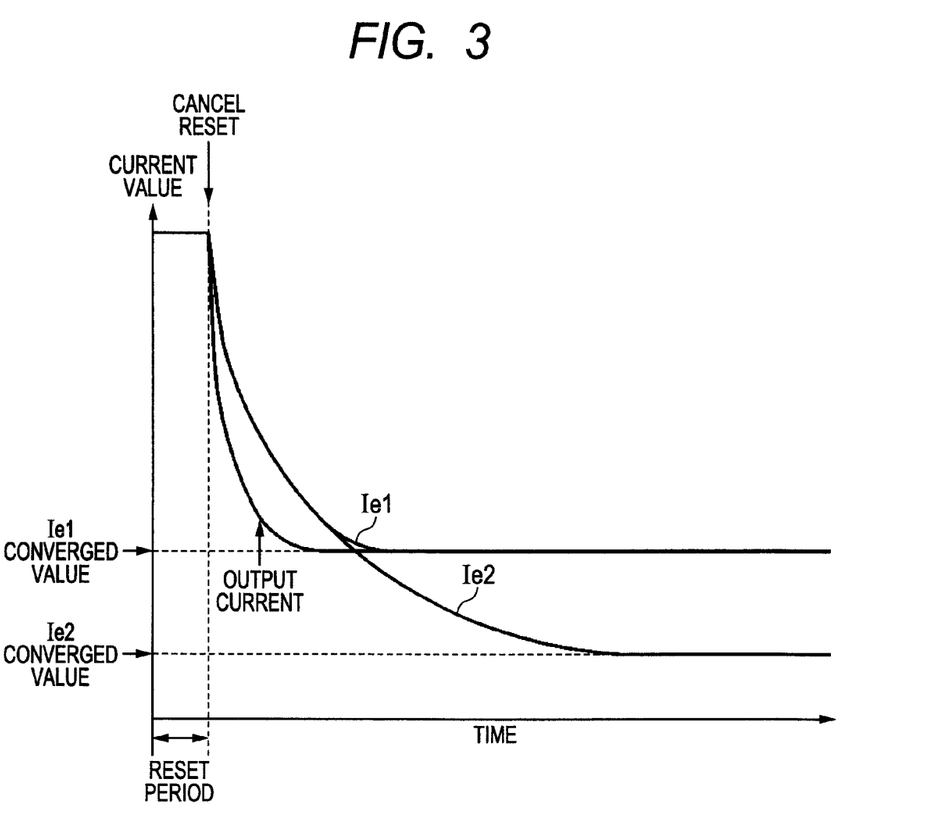
FIG. 3 is a diagram illustrating an operation of the photoelectric conversion apparatus according to the first embodiment of the present invention.

Here, FIG. 3 illustrates a schematic diagram of a time-dependent waveform of each of the emitter currents Ie1 and Ie2. It can be seen from the Figure that similar excessive current components are generated in the emitter currents Ie1 and Ie2. This is because a same mechanism of feedback from the base of the emitter is provided to the bipolar transistors 120 and 180. In other words, in the bipolar transistor 120, feedback is performed via the MOSFETs 150 and 160, and the bipolar transistor 180, feedback is performed via the MOSFETs 210 and 220. Using the excessive current components of Ie2 exhibiting a figure substantially similar to that of Ie1, which have been generated as described above, correction of Ie1 is performed in the arithmetic operation unit 115. Now, it is assumed that the element size (W/L) ratio between the MOSFETs 230 and 240 in the arithmetic operation unit 115 is a ratio calculated by expression (8) below.

[Expression 8]

$$(W/L)_{230}:(W/L)_{240} = 1:a \quad (8)$$

Here, W is a gate width of each of the MOSFETs and L is a gate length of each of the MOSFETs. Here, the drain current of the MOSFET 230 is 1/a of the drain current of the MOSFET 240, that is, 1/a of the emitter current Ie2 of the bipolar transistor 180. Accordingly, a current Iout output from the current output terminal 60 is calculated by expression (9) below.

[Expression 9]

$$I_{out} = I_{e1} - \frac{I_{e2}}{a} \quad (9)$$

The arithmetic operation unit 115 outputs the current Iout obtained by subtracting a current resulting from the current Ie2 amplified by the second current amplifier 80 being multiplied by a coefficient (1/a) from the current Ie1 amplified by the first current amplifier 20. As a result of subtraction between the emitter currents Ie1 and Ie2, the excessive current components in Ie1 can be reduced as illustrated in FIG. 3, enabling enhancement of the converging characteristics of the output current Iout. Furthermore, based on expressions (6), (7) and (9), the current Iout output from the current output terminal 60 converges on a value obtained by expression (10).

[Expression 10]

$$I_{out} \approx hFE \times \left\{ I_p + I_{d1} + \left(1 - \frac{1}{a}\right) I_{d2} \right\} \quad (10)$$

Accordingly, compared with expression (6), it can be understood that the dark current components contained in the converged output current Iout can also be reduced. As described above, the embodiment in FIG. 2 enables provision of a photoelectric conversion apparatus in which when an operation to reset the photoelectric conversion element 10 is performed, an output current Iout from the pixel exhibits favorable converging characteristics. In addition, the embodiment enables provision of a photoelectric conversion apparatus with favorable SN ratio characteristics by reducing the dark current components in the output current Iout.

Second Embodiment

Next, a photoelectric conversion apparatus according to a second embodiment of the present invention will be described. However, here, only differences from the above-described first embodiment will be described. The second embodiment is different from the first embodiment in that the element size (W/L) of the MOSFET 230 is made to be smaller than the element size (W/L) MOSFET 240 in the arithmetic operation unit 115 in FIG. 2, enabling provision of a photoelectric conversion apparatus with a favorable configuration in which when an operation to reset the photoelectric conversion element 10 is performed, an output current Iout from the pixel exhibits favorable converging characteristics as a result of performing a favorable arithmetic operation in the arithmetic operation unit 115.

Figure 4:
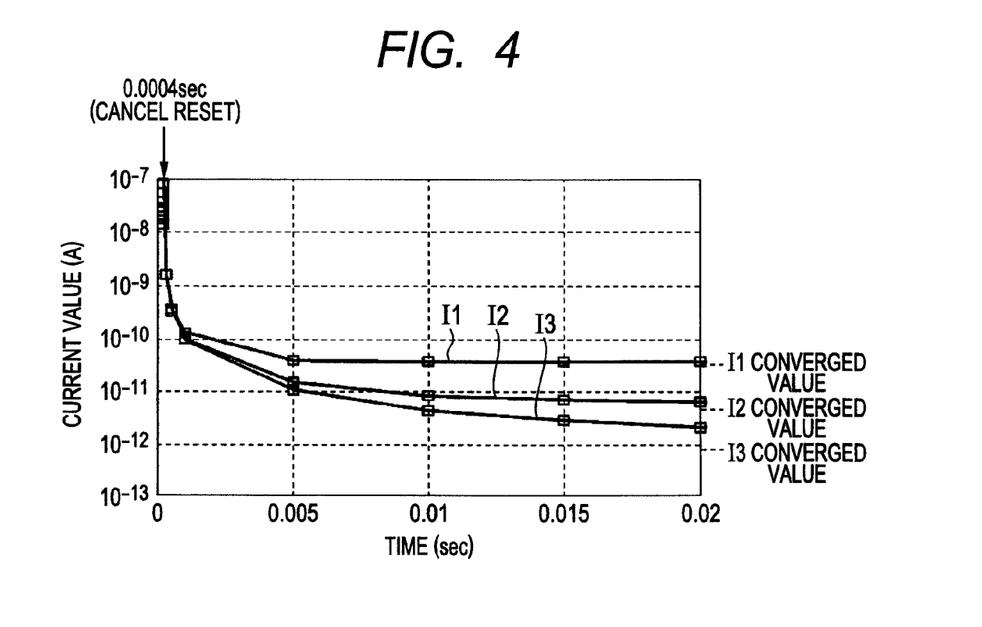
FIG. 4 is a diagram indicating simulation results according to a second embodiment of the present invention.

FIG. 4 illustrates simulation results of time-dependent waveforms (I1, I2 and I3) of an emitter current Ie1 of a bipolar transistor 120 for three values of a photocurrent Ip (a certain current value, the current value/4 and the current value/16). In the Figure, at the point of time of 0.0004 seconds, the reset of a base potential of the bipolar transistor 120 is canceled. In other words, a MOSFET 130 is turned off. After cancellation of the reset, with the above-described operation, the emitter current Ie1 of the bipolar transistor 120 converges on a current value obtained by expression (6), which corresponds to the respective photocurrent Ip. Here, it can be understood that as the value of the photocurrent Ip becomes smaller, more time is required for convergence.

Figure 5:
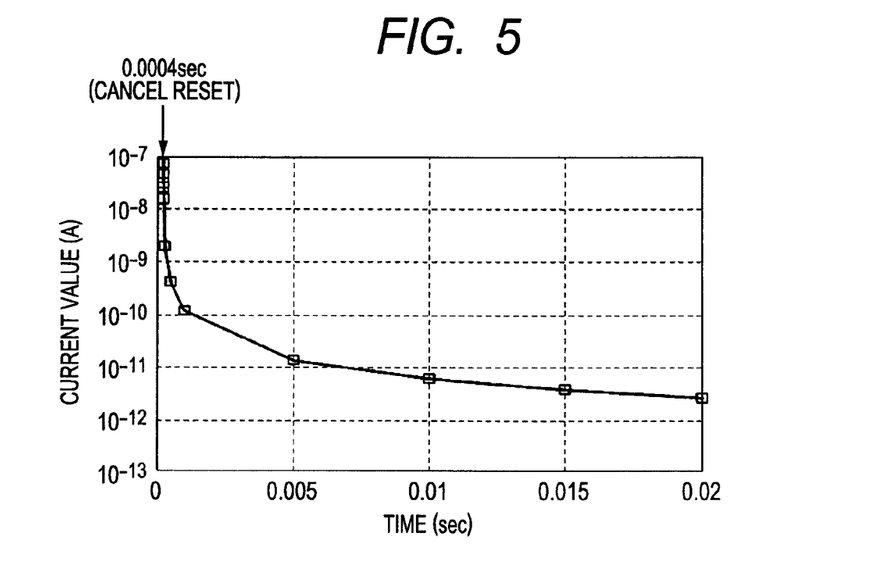
FIG. 5 is a diagram indicating simulation results according to the second embodiment of the present invention.

Next, FIG. 5 illustrates time-dependent simulation results of an emitter current Ie2 of a bipolar transistor 180. In the Figure, at the point of time of 0.0004 seconds, the reset of a base potential of the bipolar transistor 180 is cancelled, and finally converges on a current value obtained by expression (7).

Figure 6:
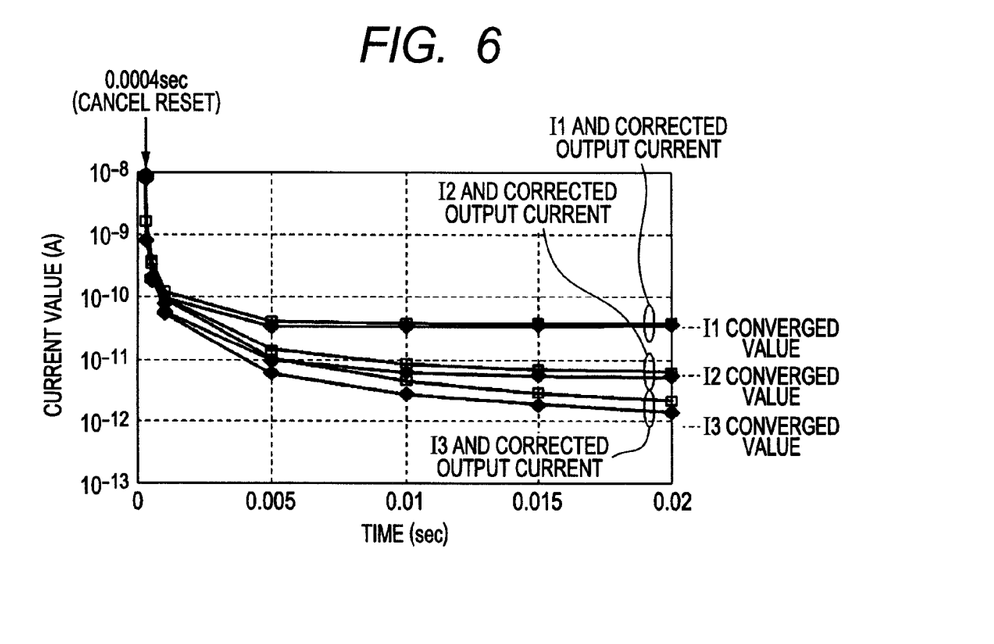
FIG. 6 is a diagram indicating simulation results according to the second embodiment of the present invention.
Figure 7:
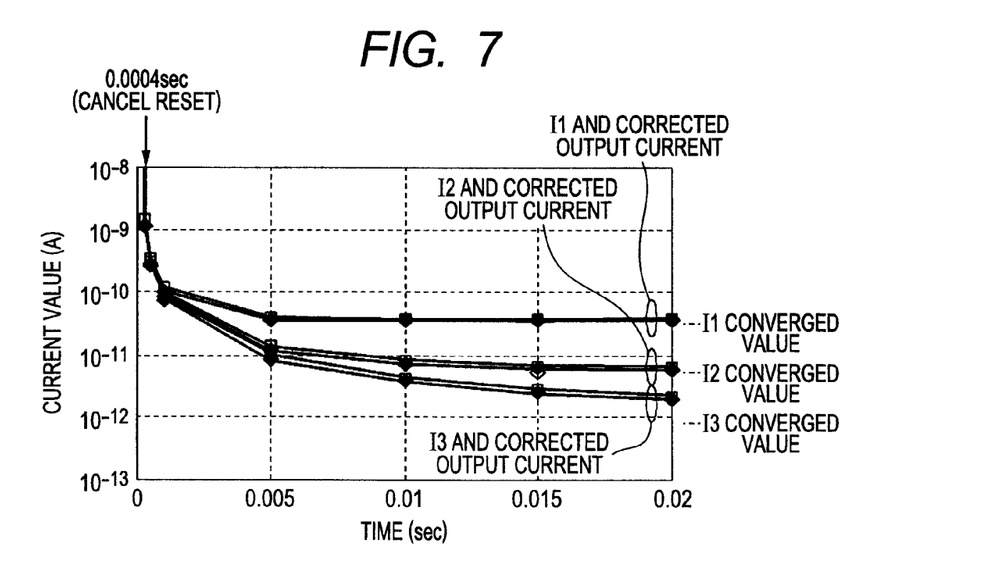
FIG. 7 is a diagram indicating simulation results according to the second embodiment of the present invention.
Figure 8:
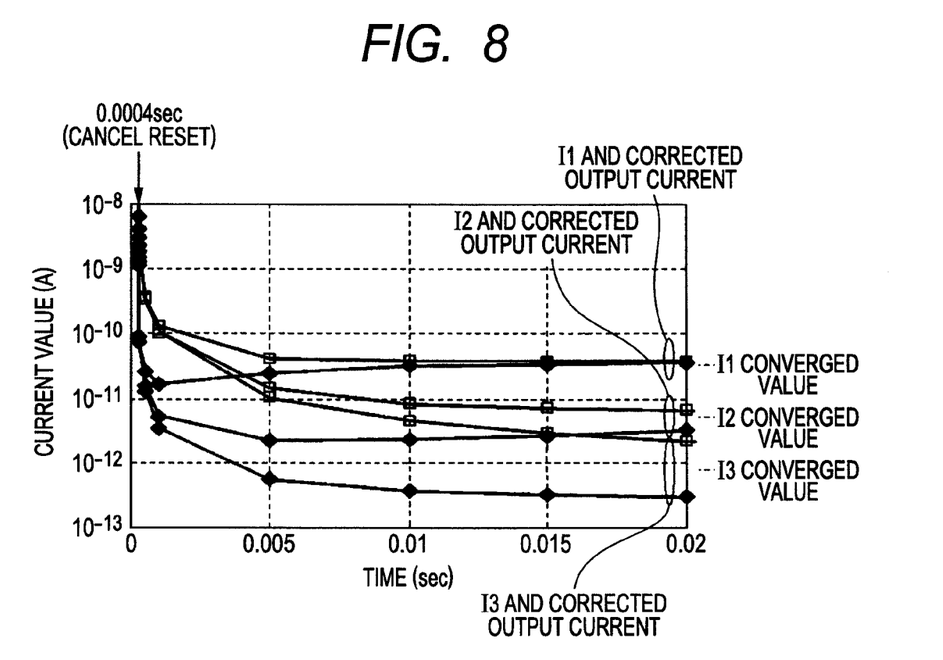
FIG. 8 is a diagram indicating simulation results according to the second embodiment of the present invention.

FIGS. 6, 7 and 8 indicate currents output from a current output terminal 60 when the element size ratio a between the MOSFETs 230 and 240 defined by expression (8) is 2, 4 and 1, respectively. Furthermore, for comparison, the values of the current Ie1 that are the same as those in FIG. 4 are also plotted in the Figures. In the Figures, symbol ♦ indicates a current output from the current output terminal 60 and symbol □ indicates Ie1. In FIG. 6, since a=2, based on expression (9), a current corresponding to ½ of Ie2 in FIG. 5 is subtracted from each of the currents Ie1 in FIG. 4, and the resulting current is output from the current output terminal 60. It can be seen that the converging characteristics of the current (♦) output from the current output terminal 60 have been enhanced compared with Ie1 (□). In FIG. 7, since a=4, based on expression (9), a current corresponding to ¼ of Ie2 in FIG. 5 is subtracted from the current Ie1 in FIG. 4, and the resulting current is output from the current output terminal 60. It can be seen that the effect of enhancement of the converging characteristics is small compared with FIG. 6. In FIG. 8, since a=1, based on expression (9), a current corresponding Ie2 multiplied by 1 in FIG. 5 is subtracted from the current Ie1 in FIG. 4, and the resulting current is output from the current output terminal 60. In this case, it can be seen that only a small enhancement effect can be provided. Accordingly, it is desirable for an arithmetic operation in the arithmetic operation unit 115 in FIG. 2 to reduce the output current of a correction pixel 250 to ¼ to 1 times and subtract the output current from the emitter current Ie1 of the bipolar transistor 120.

As described above, the second embodiment enables provision of a photoelectric conversion apparatus with a favorable configuration in which when an operation to reset the photoelectric conversion element 10 is performed, the output current Iout from the pixel exhibits favorable converging characteristics.

Third Embodiment

Figure 9:
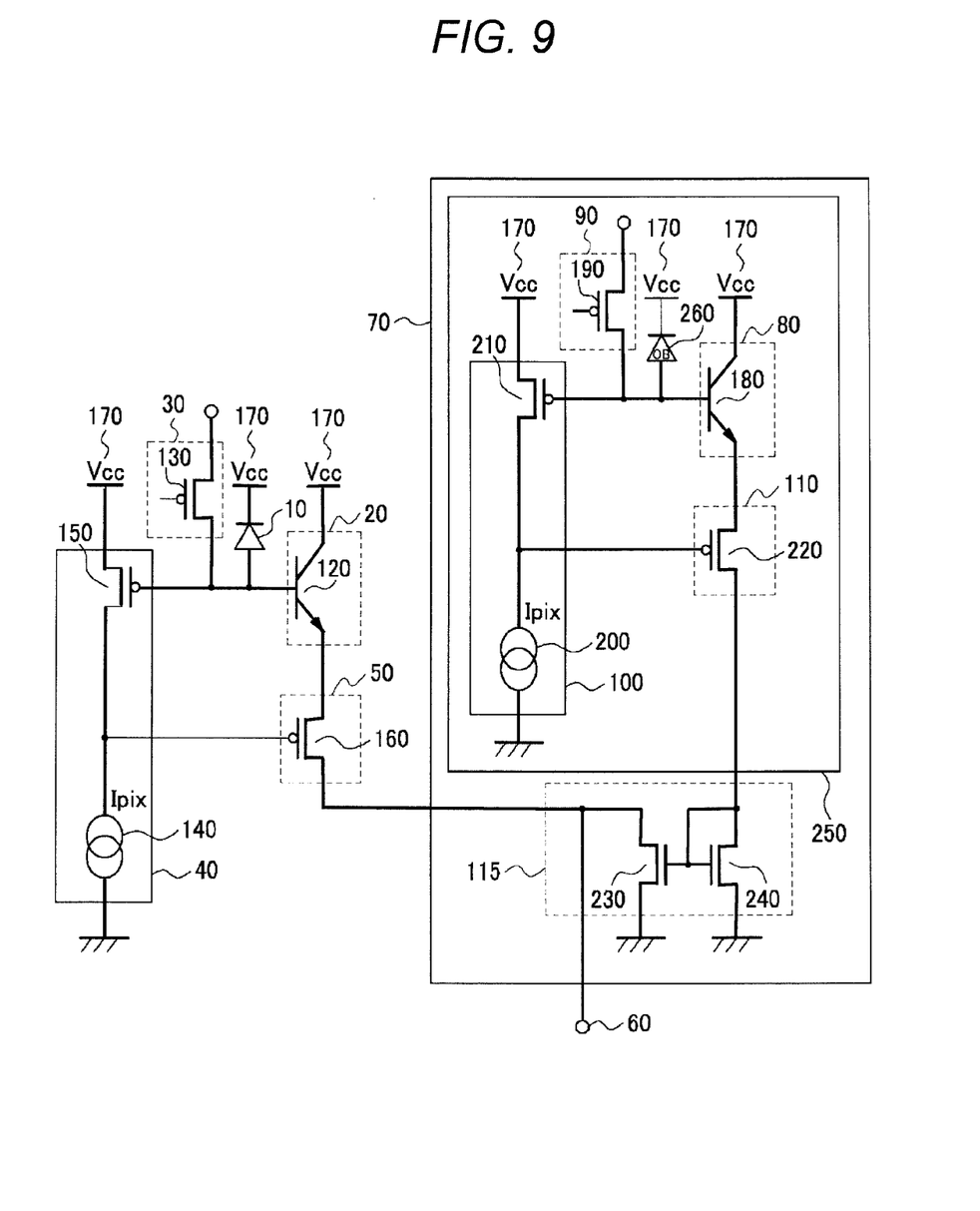
FIG. 9 is a diagram illustrating an exemplary configuration of a photoelectric conversion apparatus according to a third embodiment of the present invention.

FIG. 9 is a diagram illustrating an exemplary configuration of a photoelectric conversion apparatus according to a third embodiment of the present invention. However, here, only differences from the above-described first embodiment will be described. In FIG. 9, the third embodiment is different from the embodiment in FIG. 2 in that a second photoelectric conversion element (photodiode) 260, which is shielded from light, is provided in a correction pixel 250 and an anode thereof is connected to a base of a bipolar transistor 180. In other words, the second photoelectric conversion element 260 is connected to the second current input terminal 85 (FIG. 1). Consequently, dark current components in a current output from a current output terminal 60 can be reduced. In FIG. 9, an emitter current Ie2 of a bipolar transistor 180 converges on a value obtained by expression (11) below.

[Expression 11]

$$I_{e2} \approx hFE \times (I_{d1} + I_{d2}) \quad (11)$$

Accordingly, based on expressions (6), (9) and (11), a current Iout output from the current output terminal 60 can be calculated by expression (12) below, and more dark current components can be reduced in the converged current Iout compared to the case of expression (10)

[Expression 12]

$$I_{out} \approx hFE \times \left\{ I_p + \left(1 - \frac{1}{a}\right)I_{d1} + \left(1 - \frac{1}{a}\right)I_{d2} \right\} \quad (12)$$

As described above, the embodiment in FIG. 9 enables provision of a photoelectric conversion apparatus in which when an operation to reset a photoelectric conversion element 10 is performed, an output current Iout from the pixel exhibits favorable converging characteristics, and dark current components in the output current Iout are reduced, providing good S/N ratio characteristics.

Fourth Embodiment

Figure 10:
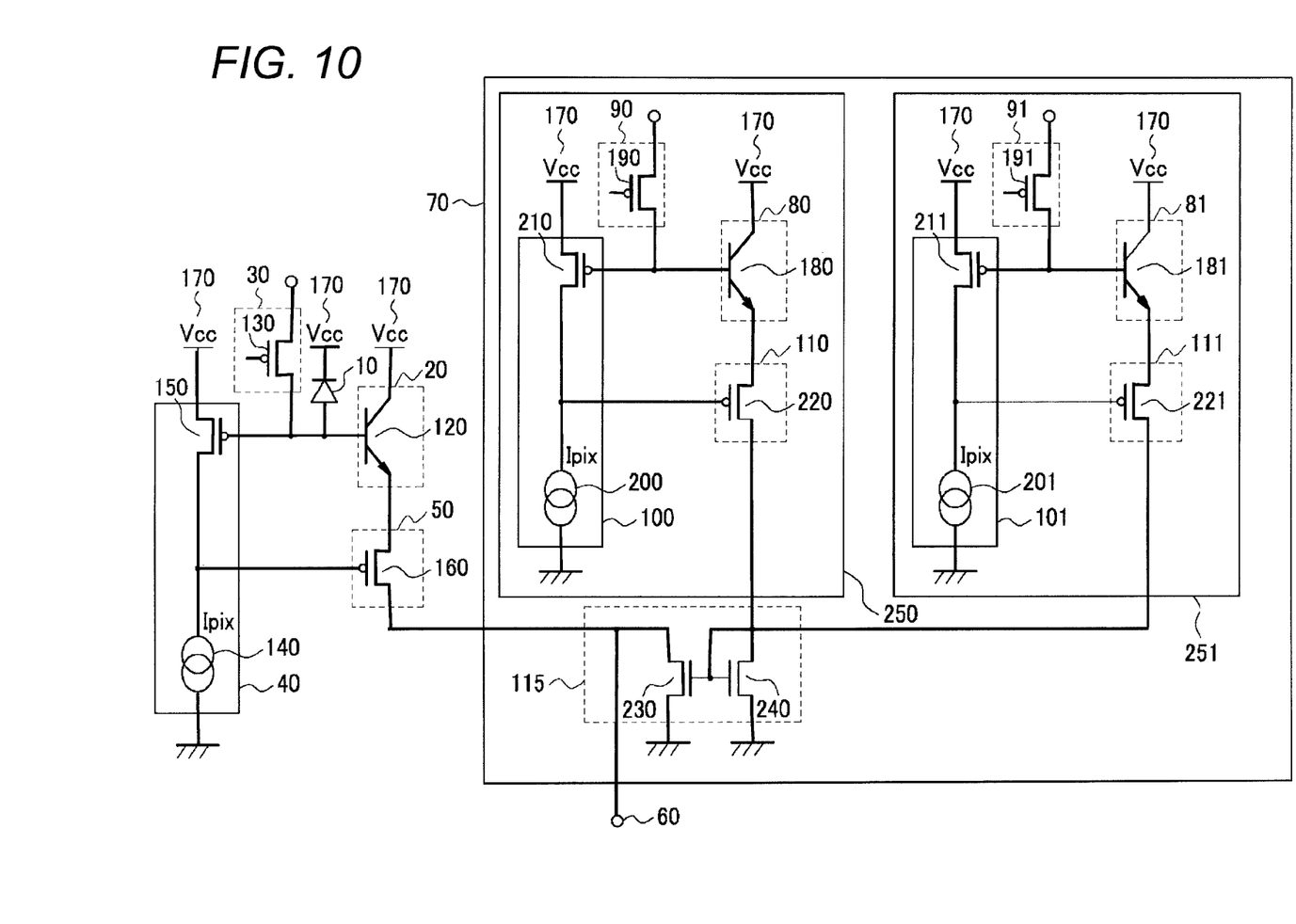
FIG. 10 is a diagram illustrating an exemplary configuration of a photoelectric conversion apparatus according to a fourth embodiment of the present invention.

FIG. 10 is a diagram illustrating an exemplary configuration of a photoelectric conversion apparatus according to a fourth embodiment of the present invention. However, here, only differences from the above-described first embodiment will be described. In FIG. 10, the fourth embodiment is different from the embodiment in FIG. 2 in that two correction pixels 250 and 251 are provided in a correction unit 70, and output currents of the correction pixels are added up and input to an arithmetic operation unit 115. The correction pixel 251 includes a third current amplifier 81, a third initializing unit 91, a third detector 101 and a third feedback unit 111. The correction pixel 251 includes a configuration similar to that of the correction pixel 250. The third current amplifier 81 includes a bipolar transistor 181. The amplifier 81 amplifies a current input from a third current input terminal. The third initializing unit 91 includes a MOSFET 191. The third initializing unit 91 initializes a voltage of the third current input terminal. The third detector 101 includes a MOSFET 211 and a constant current source 201. The third detector 101 detects the voltage of the third current input terminal. The third feedback unit 111 includes a MOSFET 221. The third feedback unit 111 feeds back the voltage detected by the third detector 101 to the third current amplifier 81 as a feedback signal. The arithmetic operation unit 115 performs an arithmetic operation using a current amplified by a first current amplifier 20 and a current obtained by adding up a current amplified by a second current amplifier 80 and the current amplified by the third current amplifier 81.

Consequently, an effect of variations in manufacturing processes imposed on a current Iout output from a current output terminal 60 can be reduced. In FIG. 10, a sum I of the output currents of the two correction pixels 250 and 251 converges on a value obtained by expression (13) below.

[Expression 13]

$$I \approx (hFE \times I_{d2})_{250} + (hFE \times I_{d2})_{251} \quad (13)$$

For example, where an expression obtained by dividing expression (13) by 2 and expression (7) are compared, the former is less subject to the effect of variations in manufacturing processes of hFE and/or Id2. Accordingly, an emitter current Ie1 of a bipolar transistor 120 is corrected using the former, enabling reduction of the effect of variations in manufacturing processes imposed on the current Iout output from the current output terminal 60. As described above, the embodiment in FIG. 10 enables provision of a photoelectric conversion apparatus in which when an operation to reset a photoelectric conversion element 10 is performed, an output current Iout from the pixel exhibits favorable converging characteristics, and the effect of variations in manufacturing processes is reduced.

Fifth Embodiment

Figure 11:
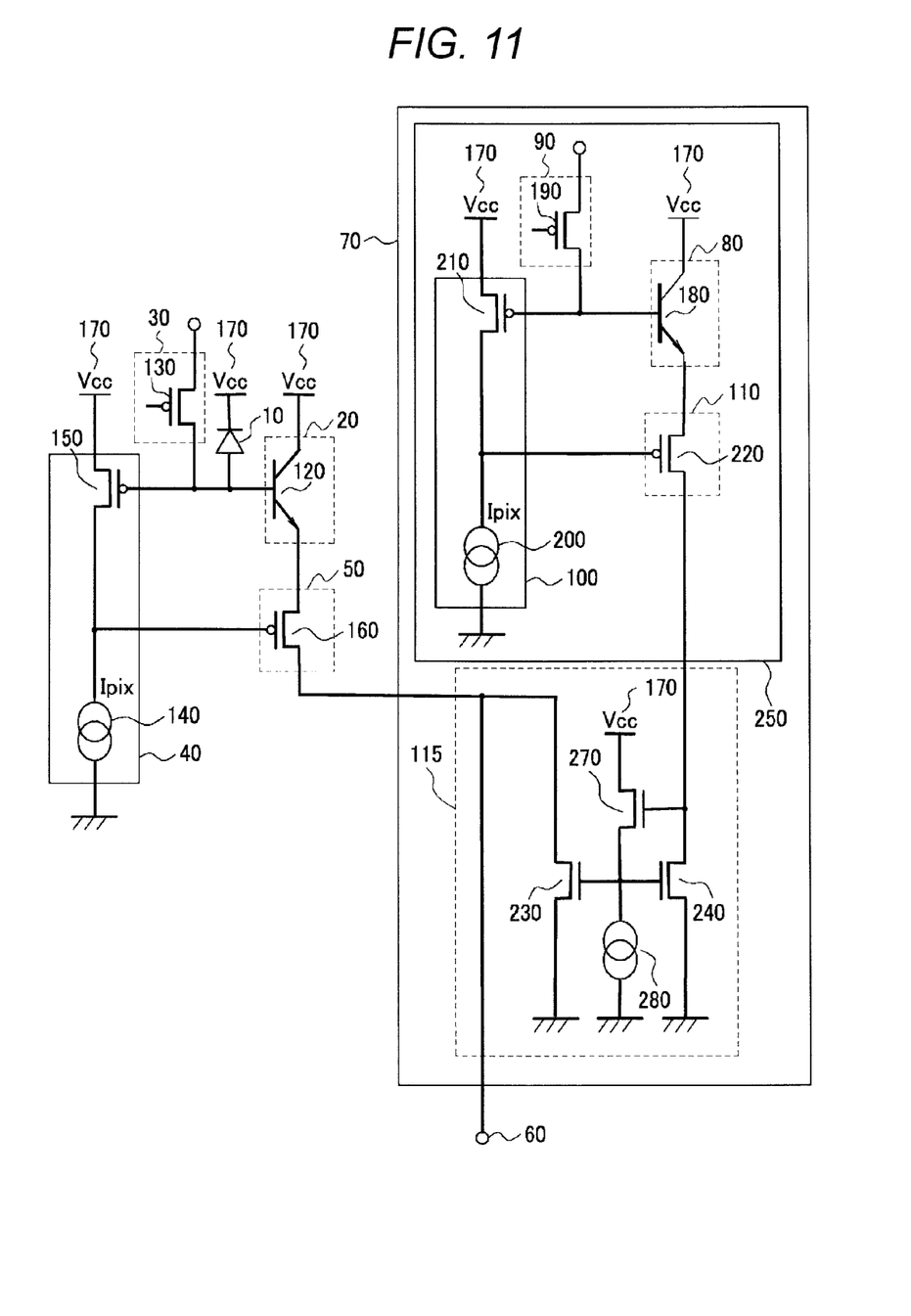
FIG. 11 is a diagram illustrating an exemplary configuration of a photoelectric conversion apparatus according to a fifth embodiment of the present invention.

FIG. 11 is a diagram illustrating an exemplary configuration of a photoelectric conversion apparatus according to a fifth embodiment of the present invention. However, here, only differences from the above-described first embodiment will be described. The embodiment in FIG. 11 is different from the embodiment in FIG. 2 in that an arithmetic operation unit 115 includes MOSFETs 230, 240 and 270, and a constant current source 280. A gate of the ninth field-effect transistor (MOSFET) 270 is connected to a drain of the eighth MOSFET 240, a drain of the same is connected to a source voltage node 170, and a source of the same is connected to a gate of the eighth MOSFET. The third constant current source 280 is connected between the source of the ninth MOSFET 270 and a reference voltage node.

Consequently, responsiveness of a drain current of the MOSFET 230 to a change in a drain current of the MOSFET 240 can be enhanced. Accordingly, current correction with higher accuracy can be provided. In FIG. 2, a total capacitance C seen from the drain and the gate of the MOSFET 240, is mainly determined by a gate-source capacitance of each of the MOSFETs 230 and 240, and thus, can be obtained by expression (14) below.

[Expression 14]

$$C \approx \left(\frac{2}{3}LWC_{ox}\right)_{230} + \left(\frac{2}{3}LWC_{ox}\right)_{240} \quad (14)$$

Here, Cox is a gate capacitance per unit area of the MOSFET, W is a gate width of the MOSFET and L is a gate length of the MOSFET. Meanwhile, a total capacitance C seen from the drain of the MOSFET 240 in FIG. 11, is mainly determined by a drain-source capacitance of the MOSFET 270, and thus, can be obtained by expression (15) below.

[Expression 15]

$$C \approx \left(\frac{2}{3}LWC_{ox}\right)_{270} \quad (15)$$

As can be seen from comparison between expressions (14) and (15), the embodiment in FIG. 11 enables reduction of the total capacitance C seen from the drain of the MOSFET 240. Accordingly, responsiveness of the drain current of the MOSFET 230 to a change in an output current of a correction pixel 250 can be enhanced. Consequently, the converging characteristics of the drain current of the MOSFET 230 can be made to be close to those of emitter currents of bipolar transistors 180 and 120. Accordingly, correction with higher accuracy can be provided. As described above, the embodiment in FIG. 11 enables provision of a photoelectric conversion apparatus in which when an operation to reset a photoelectric conversion element 10 is performed, an output current Iout from the pixel exhibits favorable converging characteristics.

Sixth Embodiment

Figure 12:
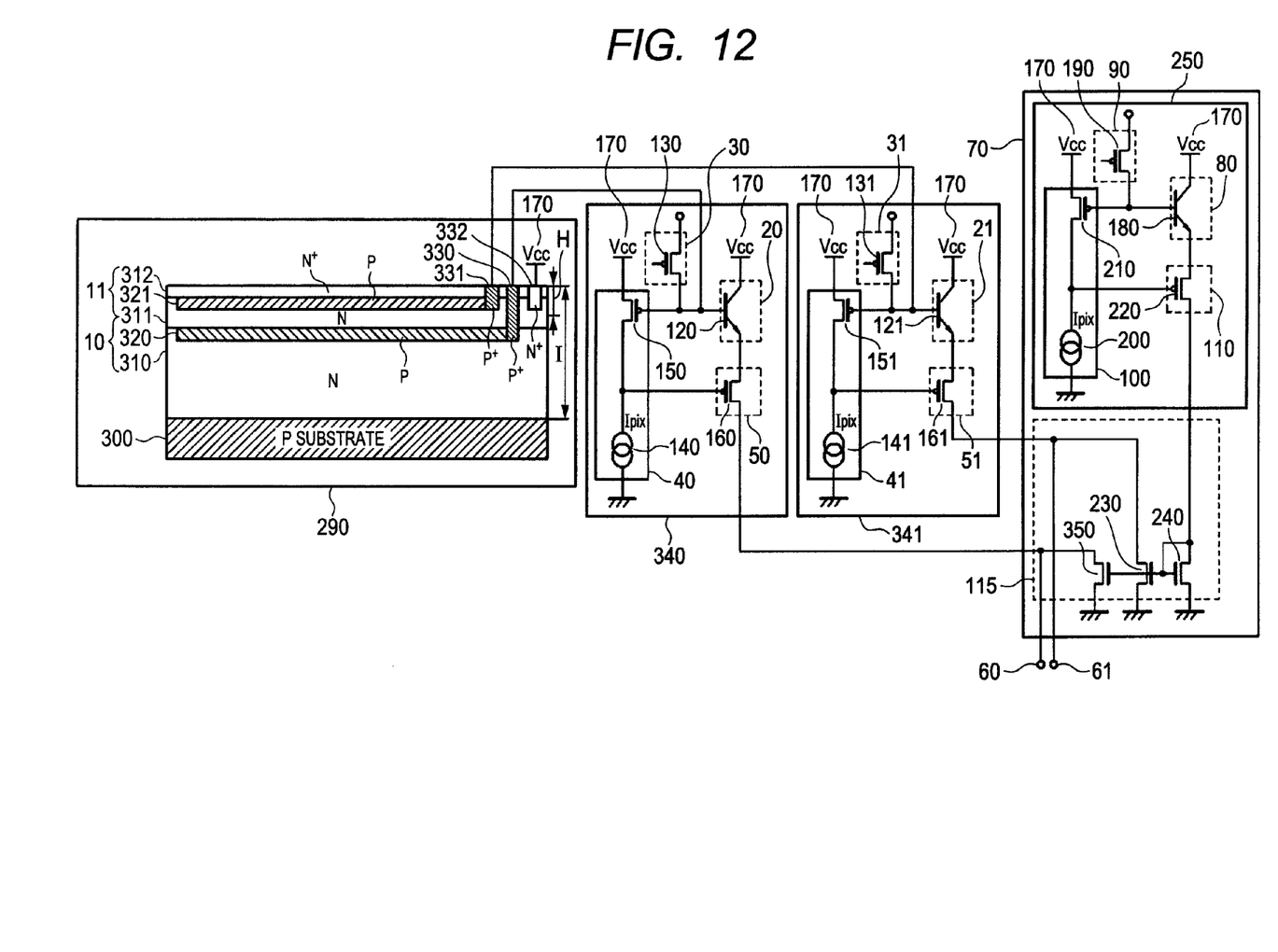
FIG. 12 is a diagram illustrating an exemplary configuration of a photoelectric conversion apparatus according to a sixth embodiment of the present invention.

FIG. 12 is a diagram illustrating an exemplary configuration of a photoelectric conversion apparatus according to a sixth embodiment of the present invention. However, here, only differences from the above-described first embodiment will be described. A photoelectric conversion unit 290 includes N-type regions and P-type regions alternately stacked on a silicon P-type substrate 300, which include an N-type region 310, a P-type region 320, an N-type region 311, a P-type region 321 and a surface N$^+$ region 312. The P-type regions 320 and 321 are formed so as to have different depths. Since light incident on silicon enters deeper in the silicon as the wavelength of the light is longer, photoelectrically converted signals for light in different wavelength bands can be obtained from the P-type regions 320 and 321. In FIG. 12, a photoelectric conversion element 10 includes the N-type region 310, the P-type region 320 and the N-type region 311, and a fourth photoelectric conversion element includes the N-type region 311, the P-type region 321 and the surface N$^+$ region 312, and the photoelectric conversion elements 10 and 11 are stacked in the depth direction. As with the first photoelectric conversion element 10, the fourth photoelectric conversion element 11 generates a current by means of a photoelectric conversion. The embodiment is configured so that contact portions 330 and 331 are provided to the P-type region 320 and 321, respectively, to read photocurrents from the respective photoelectric conversion elements 10 and 11, and readout circuits 340 and 341 are provided for the photoelectric conversion elements 10 and 11, respectively. The readout circuits 340 and 341 include bipolar transistors 120 and 121 as current amplifiers 20 and 21, respectively. Also, the readout circuits 340 and 341 include MOSFETs 130 and 131 as initializing units 30 and 31, respectively, constant current sources 140 and 141 and MOSFETs 150 and 151 as detectors 40 and 41, respectively, and current output terminals 60 and 61, respectively. Furthermore, in FIG. 12, an N-type contact portion 332 is provided in the N-type region 311 and the surface N$^+$-type region 312 for connection with a power supply terminal 170. As described above, in FIG. 12, the readout circuits 340 and 341 are provided in the photoelectric conversion elements 10 and 11, respectively. Provision of a favorable configuration to a correction unit 70 in response to the above enables enhancement of the converging characteristics of respective output currents Iout when operations to reset respective photoelectric conversion elements 10 and 11 are performed, as well as space saving and dark current reduction.

The readout circuit 341, which includes a fourth current amplifier 21, a fourth initializing unit 31, a fourth detector 41 and a fourth feedback unit 51, includes a configuration similar to that of the readout circuit 340. The fourth current amplifier 21 includes the bipolar transistor 121, and amplifies a current input from the fourth photoelectric conversion element 11 through a fourth current input terminal. The fourth initializing unit 31 includes the MOSFET 131 and initializes a voltage of the fourth current input terminal. The fourth detector 41 includes the MOSFET 151 and the constant current source 141, and detects the voltage of the fourth current input terminal. The fourth feedback unit 51 includes a MOSFET 161, feeds back the voltage detected by the fourth detector 41 to the fourth current amplifier 21 as a feedback signal. The photoelectric conversion elements 10 and 11 are stacked by alternately stacking a plurality of photoelectric conversion regions of a first conductivity type and photoelectric conversion regions of a second conductivity type opposite to the first conductivity type. The correction unit 70 corrects currents amplified by the first current amplifier 20 and the fourth current amplifier 21. More specifically, the correction unit 70 corrects currents amplified by the first current amplifier 20 and the fourth current amplifier 21, based on the current amplified by the second current amplifier 80.

Figure 13:
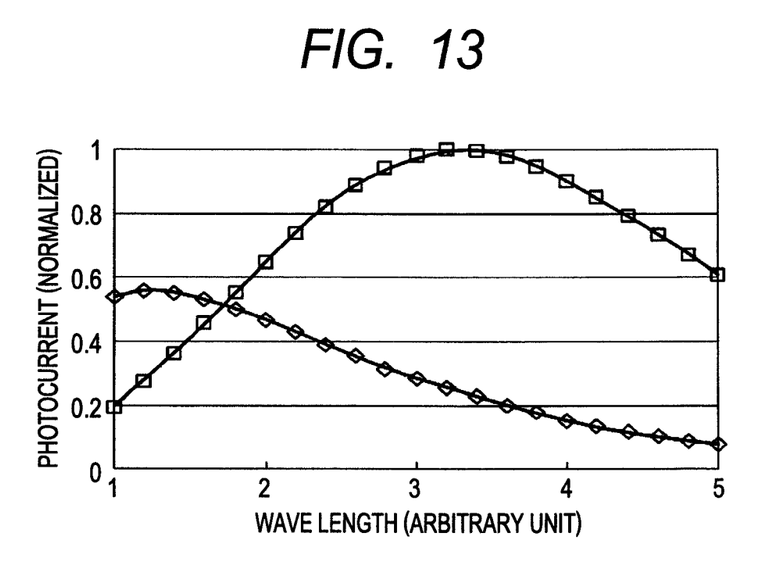
FIG. 13 is a diagram illustrating simulation results for spectral characteristics of a photoelectric conversion apparatus.

FIG. 12 indicates a peak position H in an impurity profile of the N-type region 311 and a total thickness I of the semiconductor layers formed on the P-type substrate 300. In FIG. 12, the spectral characteristics of the photoelectric conversion elements 10 and 11 are mainly determined by these two factors. FIG. 13 illustrates simulation results of the spectral characteristics when H and I have certain values. In FIG. 13, the abscissa axis represents the wavelength of applied light, and the ordinate axis represents photocurrents obtained from the respective photoelectric conversion elements 10 and 11, the spectral characteristics having a peak at a wavelength of a little over 1 are the characteristics of the photoelectric conversion element 11, and the spectral characteristics having a peak at a wavelength of a litter over 3 are the characteristics of the photoelectric conversion element 10. In the case of the spectral characteristics in FIG. 13, the photoelectric conversion element 10 can provide a photocurrent larger than that of the photoelectric conversion element 11 for light sources with most spectral characteristics. Thus, the output current of the readout circuit 340 exhibits more favorable converging characteristics after reset of a base potential than that of the readout circuit 341. Thus, in FIG. 12, it is possible to provide a MOSFET 230 while eliminating a MOSFET 350 to output the output current of the readout circuit 340 as it is with no correction made to the output current. Furthermore, although in FIG. 12, a same correction pixel 250 is used for the readout circuits 340 and 341 to make correction, the photoelectric conversion elements 10 and 11 generate different dark currents. Thus, correction is made using different correction pixels 250 for the respective readout circuits 340 and 341, enabling favorable dark current reduction.

In other words, the other correction pixel 250 includes a fifth current amplifier that amplifies a current input from a fifth current input terminal, a fifth initializing unit that initializes a voltage of the fifth current input terminal, a fifth detector that detects the voltage of the fifth current input terminal, and a fifth feedback unit. The fifth feedback unit feeds back the voltage detected by the fifth detector to the fifth current amplifier as a feedback signal. The correction unit 70 corrects the current amplified by the first current amplifier 20 based on the current amplified by the second current amplifier 80, and corrects the current amplified by the fourth current amplifier 21 based on the current amplified by the fifth current amplifier.

As described above, the embodiment in FIG. 12 enables enhancement of the converging characteristics of respective output currents Iout of the photoelectric conversion elements 10 and 11 when an operation to reset the photoelectric conversion elements 10 and 11 is performed, as well as space saving and dark current reduction.

Although the first to sixth embodiments have been described in terms of an example in which photoelectric conversion elements of a type that collects holes are used as the photoelectric conversion elements and NPN bipolar transistors are used as the current amplifiers, the present invention is not limited to such example. Where photoelectric conversion elements of a type that collect electrons are used as the photoelectric conversion elements and PNP bipolar transistors are used as the current amplifiers, effects similar to those described above can be provided by providing a configuration similar to the above-described configuration.

Furthermore, the first to sixth embodiments have been described in terms of an example in which a correction unit is employed for output currents from one or two photoelectric conversion element and current amplifier sets, the present invention is not limited to such example. For example, a correction unit can be employed for cases where, for example, photoelectric conversion elements and current amplifiers are arranged in one or two dimensions.

Furthermore, although the first to sixth embodiments have been described in terms of an example in which one or two correction pixels are provided in a correction unit, the present invention is not limited to such example.

Furthermore, although the sixth embodiment has been described in terms of an example in which two photoelectric conversion elements are stacked in the depth direction, the present invention is not limited to such example. Furthermore, the sixth embodiment has been described in terms of an example in which a photoelectric conversion element formed at a position deeper from the surface provides a larger photocurrent, the present invention is not limited to such example. Furthermore, the sixth embodiment has been described in terms of an example in which a same correction pixel is used for the respective readout circuits, the present invention is not limited to such example. The first to sixth embodiments may variously be combined.

The above-described embodiments are all mere exemplary embodiments for carrying out the present invention, and the technical scope of the present invention should not be limitedly constructed by these embodiments. In other words, the present invention can be carried out in various ways without departing from the technical ideas or main features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-110518, filed May 12, 2010, which is hereby incorporated by reference herein in its entirety.

What is claimed is:

1. A photoelectric conversion apparatus comprising:
a first photoelectric conversion element for generating a current by a photoelectric conversion;
a first current amplifier for amplifying the current inputted from the first photoelectric conversion element through a first current input terminal;
a first initializing unit for initializing a voltage of the first current input terminal;
a first detector for detecting the voltage of the first current input terminal;
a first feedback unit for feeding back the voltage detected by the first detector to the first current amplifier as a feedback signal; and
a correcting unit for correcting the current amplified by the first current amplifier, wherein
the correcting unit comprises
a second current amplifier for amplifying a current inputted through a second current input terminal;
a second initializing unit for initializing a voltage of the second current input terminal;
a second detector for detecting the voltage of the second current input terminal;
a second feedback unit for feeding back the voltage detected by the second detector to the second current amplifier as a feedback signal; and
an arithmetic operation unit for performing an arithmetic operation based on the current amplified by the first current amplifier and the current amplified by the second current amplifier, to correct the current amplified by the first current amplifier.

2. The photoelectric conversion apparatus according to claim 1, wherein
the arithmetic operation unit outputs a current derived by subtracting, from the current amplified by the first current amplifier, a current derived by multiplying by a factor the current amplified by the second current amplifier.

3. The photoelectric conversion apparatus according to claim 1, wherein
the first photoelectric conversion element comprises a first photodiode,
the first current amplifier comprises a first bipolar transistor having a base connected to an anode of the first photodiode, a collector connected to a source voltage node and an emitter for outputting the amplified current,
the first initializing unit comprises a first field-effect transistor having a gate connected to a reset signal input terminal, a drain connected to the base of the first bipolar transistor, a source connected to a reset voltage node,
the first detector comprises a second field-effect transistor having a gate connected to the base of the first bipolar transistor and a source connected to the source voltage node, and having a first constant current source connected to a drain of the second field-effect transistor, and
the first feedback unit comprises a third field-effect transistor having a source connected to the emitter of the first bipolar transistor, a gate connected to the drain of the second field-effect transistor and a drain connected to the correcting unit.

4. The photoelectric conversion apparatus according to claim 3, wherein
the second current amplifier comprises a second bipolar transistor having a collector connected to the source voltage node and an emitter for outputting the amplified current,
the second initializing unit comprises a fourth field-effect transistor having a gate connected to the reset signal input terminal, a drain connected to the base of the second bipolar transistor, a source connected to the reset voltage node,
the second detector comprises a fifth field-effect transistor having a gate connected to the base of the second bipolar transistor and a source connected to the source voltage node, and having a second constant current source connected to a drain of the fifth field-effect transistor, and
the second feedback unit comprises a sixth field-effect transistor having a source connected to the emitter of the second bipolar transistor, a gate connected to the drain of the fifth field-effect transistor and a drain connected to the arithmetic operation unit.

5. The photoelectric conversion apparatus according to claim 4, wherein
the arithmetic operation unit comprises
a seventh field-effect transistor having a drain connected to the drain of the third field-effect transistor and a source connected to a reference voltage node, and
an eighth field-effect transistor having a gate connected to a gate of the seventh field-effect transistor, a drain connected to the drain of the sixth field-effect transistor and a source connected to the reference voltage node.

6. The photoelectric conversion apparatus according to claim 1, further comprising
a second photoelectric conversion element connected to the second current input terminal, and being light shielded.

7. The photoelectric conversion apparatus according to claim 1, wherein the correcting unit comprises a third current amplifier for amplifying a current inputted through a third current input terminal;

a third initializing unit for initializing a voltage of the third current input terminal;

a third detector for detecting the voltage of the third current input terminal; and a third feedback unit for feeding back the voltage detected by the third detector to the third current amplifier as a feedback signal, wherein the arithmetic operation unit performs an arithmetic operation based on the current amplified by the first current amplifier and the current amplified by the second and third current amplifiers.

8. The photoelectric conversion apparatus according to claim 5, wherein the arithmetic operation unit comprises a ninth field-effect transistor having a gate connected to the drain of the eighth field-effect transistor, a drain connected to the source voltage node and a source connected to the gate of the eighth field-effect transistor, and a third constant current source connected to the source of the ninth field-effect transistor.

9. The photoelectric conversion apparatus according to claim 1, further comprising a fourth photoelectric conversion element for generating a current by a photoelectric conversion;

a fourth current amplifier for amplifying the current inputted from the fourth photoelectric conversion element through a fourth current input terminal;

a fourth initializing unit for initializing a voltage of the fourth current input terminal;

a fourth detector for detecting the voltage of the fourth current input terminal;

a fourth feedback unit for feeding back the voltage detected by the fourth detector to the fourth current amplifier as a feedback signal, wherein the first and fourth photoelectric conversion elements are stacked one on the other, such that a photoelectric conversion region of a first conductivity type and a photoelectric conversion region of a second conductivity type opposite to the first conductivity type alternatively stacked, and the correcting unit corrects a current amplified by the first and fourth current amplifiers.

10. The photoelectric conversion apparatus according to claim 9, wherein the correcting unit corrects a current amplified by the first and fourth current amplifiers, based on the current amplified by the second current amplifier.

11. The photoelectric conversion apparatus according to claim 9, wherein the correcting unit further comprises a fifth current amplifier for amplifying a current inputted through a fifth current input terminal;

a fifth initializing unit for initializing a voltage of the fifth current input terminal;

a fifth detector for detecting the voltage of the fifth current input terminal; and a fifth feedback unit for feeding back the voltage detected by the fifth detector to the fifth current amplifier as a feedback signal, wherein the correcting unit corrects the current amplified by the first current amplifier based on the current amplified by the second current amplifier, and corrects the current amplified by the fourth current amplifier based on the current amplified by the fifth current amplifier.

* * * * *